United States Patent [19]
Douglas

[11] Patent Number: 6,064,270
[45] Date of Patent: May 16, 2000

[54] SYSTEM AND METHOD FOR COMPENSATING FOR REFERENCE FREQUENCY DRIFT IN A COMMUNICATIONS SYSTEM

[75] Inventor: Robert Keith Douglas, San Diego, Calif.

[73] Assignee: Uniden San Diego Research & Development Center, San Diego, Calif.

[21] Appl. No.: 09/063,812

[22] Filed: Apr. 21, 1998

[51] Int. Cl.[7] ....................................... H03L 7/00
[52] U.S. Cl. ............................. 331/1 R; 331/4; 331/10; 331/16; 331/179
[58] Field of Search ................... 331/1 R, 4, 10, 331/11, 16, 179

[56] References Cited

U.S. PATENT DOCUMENTS

| | | | |
|---|---|---|---|
| 5,041,799 | 8/1991 | Pirez | 331/44 |
| 5,121,086 | 6/1992 | Srivastava | 331/17 |
| 5,254,958 | 10/1993 | Flach et al. | 331/16 |
| 5,552,749 | 9/1996 | Nowatski et al. | 331/16 |

*Primary Examiner*—Siegfried H. Grimm
*Attorney, Agent, or Firm*—William J. Benman; Daniel R. Brown

[57] ABSTRACT

A system for compensating for reference frequency drift in a communications system. The inventive system includes a frequency source for providing a reference frequency. An error determination circuit determines if the reference frequency is within a predetermined range of a desired reference frequency and provides an error signal in response thereto. A frequency correction circuit steps the reference frequency up and/or down by a predetermined amount in response to the error signal until the reference frequency is within the predetermined range of the desired reference frequency. In a specific embodiment, the predetermined amount is twice the short-term capture range of the reference frequency which corresponds to approximately four parts per million. The predetermined range is the short-term capture range or two parts per million. The predetermined range is dependent upon the reference frequency band in which the receiver can successfully receive and decode the receive signal. The frequency source includes a voltage-controlled temperature-compensated crystal oscillator (VC-TCXO). The error determination circuit is a processor connected to the receiver. The processor includes a short-term frequency drift detector/compensator that generates a first control voltage input to the VC-TCXO for correcting the reference frequency in response to the error signal. The processor further includes a digital signal processing circuit for processing signals received from the receiver and determining the error signal in response thereto. The frequency correction circuit includes a long-term frequency drift detector/compensator that generates a second control voltage that is input to the VC-TCXO for correcting the reference frequency in response to the signal. In a more specific embodiment, the long-term frequency drift detector receives a correction signal from the short-term frequency drift detector indicating if the short-term frequency drift detector was successful in adjusting the reference frequency to the desired reference frequency.

15 Claims, 3 Drawing Sheets

SYSTEM AND METHOD FOR COMPENSATING FOR REFERENCE FREQUENCY DRIFT IN A COMMUNICATIONS SYSTEM

BACKGROUND OF THE INVENTION

1. Field of Invention

This invention relates to communications systems. Specifically, the present invention relates to oscillators and their associated periodic signals used in communications systems.

2. Description of the Related Art

Periodic electronic signals are used in a variety of demanding applications including reference signals used to modulate and demodulate signals in analog circuits and clocks for digital circuits. Such applications often require very accurate low-noise signals that can be generated with minimal power consumption and maintained accurate over a range of frequencies.

The accuracy of such signals is particularly important in digital communications systems such as code division multiple access (CDMA) systems or time division multiple access (TDMA) systems. CDMA communications systems are characterized by a plurality of mobile transceivers in communication with one or more base stations. Each transceiver includes a transmitter and a receiver. The transceivers require an accurate and precise reference frequency with low frequency drift characteristics to communicate with a base station. Crystal oscillators are often used to provide the requisite reference frequencies. Unfortunately, the frequency of the signals output by crystal oscillators tend to drift with time and temperature.

To account for time and temperature frequency drift, voltage controlled, temperature compensated crystal oscillators (VC-TCXOs) are often employed. A VC-TCXO is typically an open-loop device that includes a temperature sensing circuit that outputs a control signal to a frequency tuning circuit connected to a crystal oscillator. The temperature sensing circuit uses stored information corresponding to the crystal oscillator's frequency versus temperature profile to generate the control signal. The frequency tuning circuit uses the control signal to stabilize the frequency of the VC-TXO in response to changes in temperature.

Unfortunately, VC-TCXOs often include additional automatic frequency control (AFC) loops and analog tuning devices which occupy valuable circuit board space and consume power. Also, VC-TCXOs are typically expensive and have limited ability to compensate for oscillator frequency drift due to oscillator aging.

Another accurate but expensive oscillator is the digitally compensated crystal oscillator (DCXO). DCXOs require an expensive dedicated controller that must be calibrated for the crystal oscillator that it is designed to control. In addition, DCXOs typically have limited ability to compensate for age-related oscillator frequency drift.

To compensate for aging, an open-loop system employing a microprocessor and a voltage controlled oscillator (VCO) is often employed. Long-term oscillator frequency drift characterization data is stored in memory. The microprocessor accesses the characterization data and applies an age-compensating signal to the VCO. This system is often expensive, requiring additional firmware, memory, processors, and frequency drift characterization data.

Hence, a need exists in the art for a system having minimal space and power requirements for compensating for long-term frequency drift characteristics of an oscillator for use in communications systems.

SUMMARY OF THE INVENTION

The need in the art is addressed by the system for compensating for reference frequency drift of the present invention. In the illustrative embodiment, the inventive system is adapted for use with a communications system and includes a frequency source for providing a reference frequency. An error determination circuit determines if the reference frequency is within a predetermined range of a desired reference frequency and provides an error signal in response thereto. A frequency correction circuit steps the reference frequency up and/or down by a predetermined amount in response to the error signal until the reference frequency is within the predetermined range of the desired reference frequency.

In a specific embodiment, the predetermined amount is twice the short-term capture range of the reference frequency which corresponds to approximately four parts per million. The predetermined range is the short-term capture range, or two parts per million.

In the illustrative embodiment, the system includes a receiver. The receiver has receive signal frequency conversion stages utilizing the reference frequency. The predetermined range is dependent upon the reference frequency band in which the receiver can successfully receive and decode the receive signal. The frequency source includes a voltage-controlled temperature-compensated crystal oscillator (VC-TCXO). The error determination circuit is a processor connected to the receiver. The processor includes a short-term frequency drift detector/compensator that generates a first control voltage input to the VC-TCXO for correcting the reference frequency in response to the error signal. The processor further includes a digital signal processing circuit for processing signals received from the receiver and determining the error signal in response thereto. The frequency correction circuit includes a long-term frequency drift detector/compensator that generates a second control voltage that is input to the VC-TCXO for correcting the reference frequency in response to the signal. The long-term frequency drift detector/compensator includes a frequency stepper that steps the frequency up by approximately four parts per million and/or down by approximately four parts per million until the reference frequency is within the predetermined range.

In a more specific embodiment, the long-term frequency drift detector receives a correction signal from the short-term frequency drift detector indicating if the short-term frequency drift detector was successful in adjusting the reference frequency to the desired reference frequency.

The novel design of the present invention is facilitated by use of the long-term drift detection circuit, and the frequency stepper, allowing long-term oscillator drift to be detected and compensated for. This relaxes the requirements on the VC-TCXO allowing other less expensive types of frequency sources to be used instead.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the preset invention word be of significant utility.

The following review of the operation of a traditional telecommunications receiver is intended to facilitate an understanding of the present invention.

Figure 1:
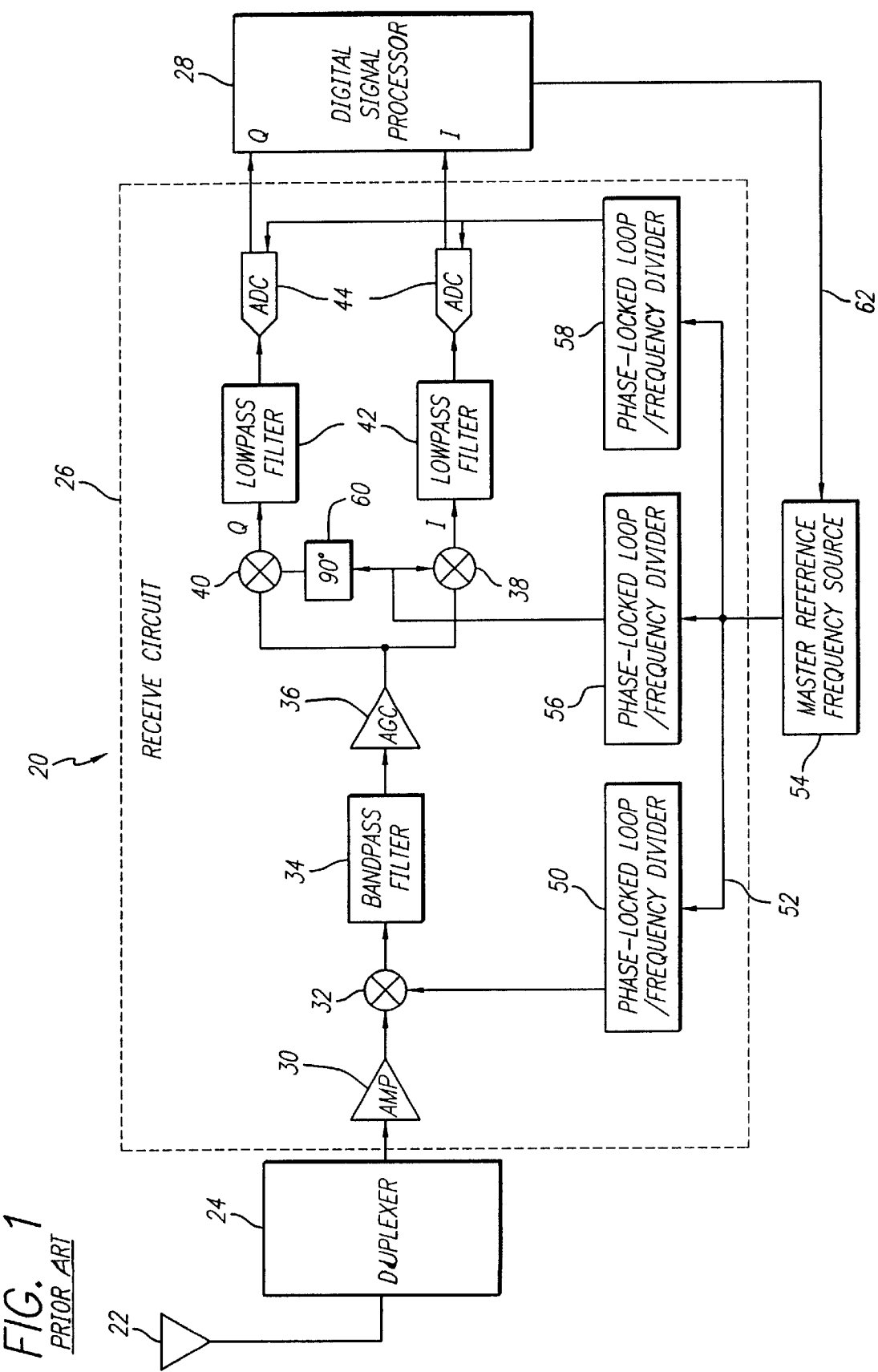
FIG. 1 is a block diagram of a conventional telecommunications receiver.

FIG. 1 is a block diagram of a conventional telecommunications receiver 20. The receiver 20 includes, from left to right, an antenna 22, a duplexer 24, a receive circuit 26, and a digital signal processor 28. A front end of the receive circuit 26 includes, from left to right, an amplifier 30, a radio frequency (RF) to intermediate frequency (IF) mixer 32, a bandpass filter 34, and an automatic gain control circuit (AGC) 36. The output of the AGC 36 is connected to a demodulator of the receive circuit that includes, from left to right, first 38 and second 40 IF-to-baseband mixers, low pass filters 42, and analog-to-digital converters (ADCs) 44.

In operation, the antenna 22 receives a transmitted RF signal that is routed through the duplexer 24 and then input to the receive circuit 26. In the receive circuit 26, the received RF signal is amplified by the amplifier 30 and then converted to an IF signal via the RF-to-IF mixer 32. The resulting IF signal is filtered by the bandpass filter 34 and output to the AGC 36 where the gain of the signal is adjusted and input, in parallel, to the IF-to-baseband mixers 38, 40. The first 38 and second 40 IF-to-baseband mixers output in-phase (I) and quadrature (Q) signal components of the IF signal, respectively. The I and Q signals are then filtered by the low pass filters 42 and converted to digital signals 50 via the ADCs 44.

The RF-to-IF mixer 32, the IF-to-baseband mixers 38 and 40, and the ADCs 44 all require a frequency reference input to successfully perform their tasks, allowing the receiver 20 to lock on to a received signal and perform the necessary frequency conversions. A first local oscillator, i.e., phase-locked loop/frequency divider (PLL) 50 supplies the RF-to-IF mixer 32 with a reference frequency by phase-locking the output of the PLL 32 to a predetermined multiple of the frequency of a master reference signal 52 from a master reference frequency source 54. Similarly, second 56 and third 58 PLLs supply the IF-to-baseband mixers 38, 40 and the ADCs 44 with reference frequencies derived from the master reference signal 52, respectively. A ninety degree phase shifter 60 shifts the phase of the reference frequency output of the second PLL 56 by ninety degrees for use by the second IF-to-baseband mixer 40.

The master reference frequency source 54 is typically a voltage-controlled temperature-compensated crystal oscillator (VC-TCXO). The frequency of the master reference signal 52 is adjustable via a frequency control signal 62 from the DSP 28 in response to signal reception errors detected by the DSP 28.

Unfortunately, as discussed in the Background of the Invention above, the frequency of the master reference signal tends to drift as the source 54 ages over time.

Figure 2:
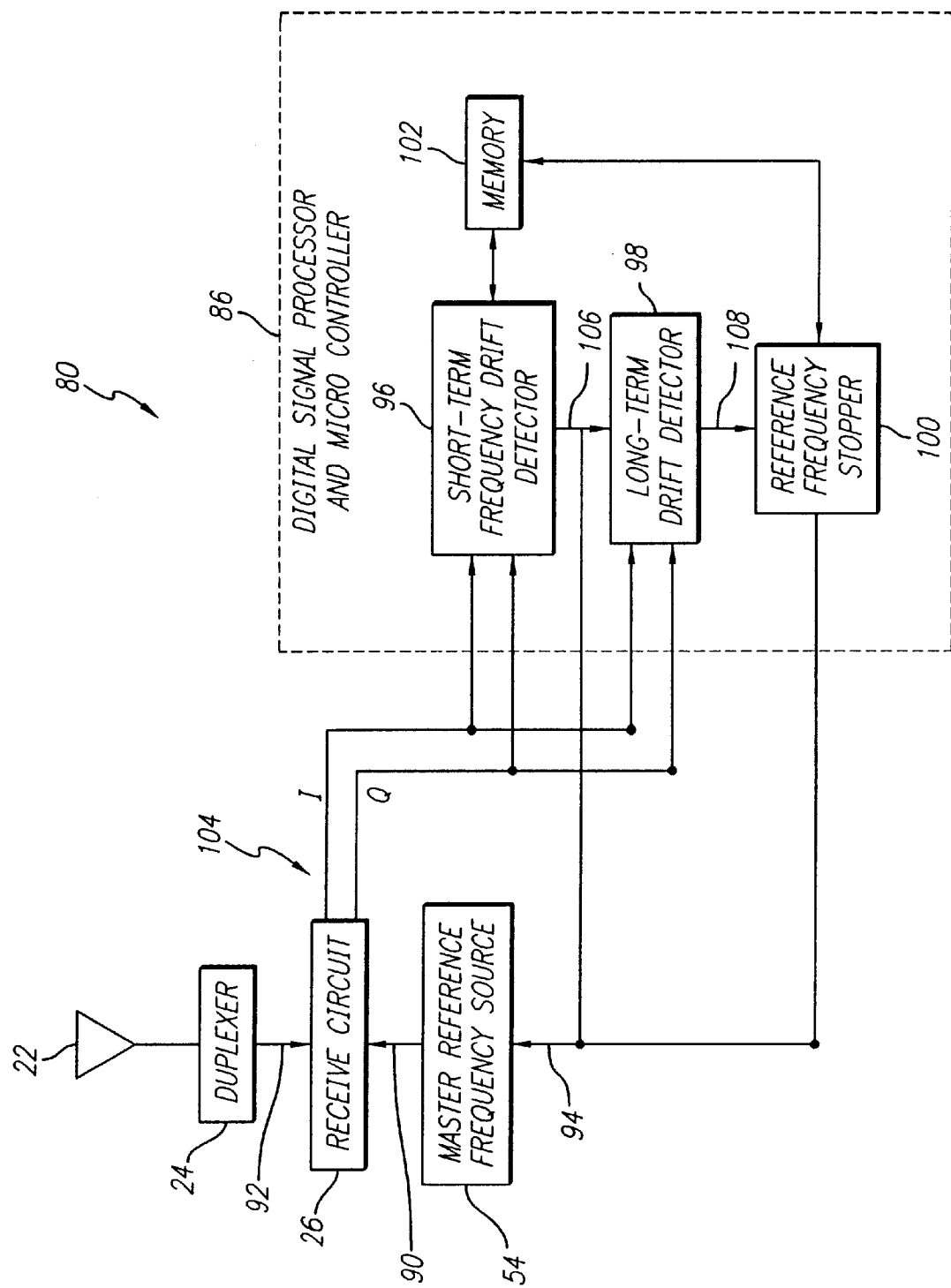
FIG. 2 is a block diagram of the system for compensating for oscillator frequency drift of the present invention adapted for use with the receiver of FIG. 1.

FIG. 2 is a block diagram of a system 80 for compensating for oscillator frequency drift of the present invention. The system 80 includes the antenna 22 connected to the receive circuit 26 that receives a reference frequency input 90 from the master reference frequency source 54 and provides input to a digital signal processor (DSP) 86 that is also connected to the master reference frequency source 54.

The receive circuit 26 includes one or more frequency conversion stages, illustrated in FIG. 1, which utilize a reference frequency. The reference frequency is provided by the periodic reference signal 90 output from the master reference frequency source 54.

In the present specific embodiment, the master reference frequency source 54 is a voltage-controlled temperature-compensated crystal oscillator (VC-TCXO). However, those skilled in the art will appreciate that an in-expensive voltage controlled oscillator (VCO) may be used for this purpose without departing from the scope of the present invention. The constructions of VC-TCXOs and VCOs are well known in the art.

The frequency accuracy of the periodic reference signal 90 affects the accuracy of frequency translations performed by the receive circuit 26 on a receive signal 92 received via the antenna 22. The frequency accuracy of the periodic reference signal 90 also affects the receive circuit's ability to lock on to the receive signal 92. The frequency of the periodic reference signal 90 is tunable via an oscillator control input 94 input to the master reference frequency source 54 via the DSP 86.

The DSP 86 includes a short-term frequency drift detector 96, a long-term frequency drift detector 98, a reference frequency stepper 100, and a memory 102 for controlling the frequency of the periodic reference signal 90 output from the master reference frequency source 54 via the oscillator control input 94. In the present embodiment, a control channel is transmitted to the receive circuit 26 to facilitate a frequency drift determination by the oscillator frequency control circuits 96, 98, 100, and 102.

The short-term frequency drift detector 96 receives baseband in-phase (I) and quadrature (Q) signals 104 from the receive circuit 26. The quality of the I and Q signals 104 is analyzed by the short-term frequency drift detection circuit 96 to determine if the frequency of the periodic reference signal 90 has drifted from a predetermined desired reference frequency. If the frequency of the periodic reference signal 90 has drifted, the short-term frequency drift detector 96 outputs a control voltage 106 to the master reference frequency source 54 via the oscillator control input 94 to correct the periodic reference signal 90. The control voltage 106 also provides input to the long-term frequency drift detector 98. The short-term frequency drift detector 96 stores the correction data, such as the size of the frequency correction applied to the reference signal 90 in the memory 102.

If the frequency error of the periodic reference signal 90 is outside a predetermined range, i.e., a capture range, corrections applied by the short-term frequency drift detector 96 via the oscillator control input 94 will be invalid. Analysis of the I and Q signals via the short-term frequency drift detector 96 will indicate that the receive signal 92 has not adequately been captured after frequency adjustments to the periodic reference signal 90. In a typical communications system, such as an IS-136 system, the capture range of the short-term frequency drift detector 96 is approximately +/−2 parts per million.

In the present embodiment, the long-term frequency drift detector 98 makes a determination as to whether or not the frequency drift of the periodic reference signal 90 is outside of the capture range. If short-term frequency drift detector 96 has failed to correct the reference frequency of the periodic reference signal 90 so that the receive circuit 26 can adequately receive the receive signal 92, then the frequency drift of the periodic reference signal 90 is outside of the capture range. The reference frequency stepping circuit 100 is then activated via an activation signal 108. Whether or not the reception of the receive signal 92 is adequate is communications system dependent.

The long-term frequency drift detector 98 may be implemented via a timing circuit. After a predetermined time the timing circuit checks to see if the short-term frequency drift detector 96 has successfully adjusted the frequency of the periodic reference signal 90 in response to an error value or signal derived from the I and Q signals 104. If after the predetermined time, the short-term frequency drift detector 96 has not corrected the periodic reference signal 90 as indicated by analysis of the I and Q signals 104 and the control voltage 106 by the long-term drift detector 98, then control is passed to the reference frequency stepper 100 via the activation signal 108.

In the present embodiment, frequency control circuits 96, 98, 100, and 102 are implemented in hardware. The construction of the short-term frequency drift detector 96 is well known in the art.

The reference frequency stepper 100 applies a voltage to the input 94 of the master reference frequency source 54 so as to step the frequency of the reference signal 90, in a first direction, by twice the capture range. The direction of the frequency adjustment and the magnitude of the frequency adjustment performed by the reference frequency stepper 100 are stored in memory 102. Those skilled in the art will appreciate the magnitudes of the adjustments made by the system of the present invention and the thresholds for same may be adjusted without departing from the scope of the present teachings.

The short-term frequency detector 96 then attempts to fine tune the frequency of the reference signal 90 so as to enable adequate reception of the transmit signal 92 as indicated by the accuracy of the I and Q signals 104. If adequate reception of the transmit signal 92 is not achieved, the reference frequency stepper 100 is activated again by the activation signal 108. This time, the reference frequency stepper 100 steps the frequency of the reference signal 90 in the opposite direction of the previous adjustment as indicated by the adjustment values stored in the memory 102. The short-term frequency drift detector 96 then fine tunes the frequency of the reference signal 90 so that the receive circuit achieves maximum reception of the receive signal 92.

Those skilled in the art will appreciate that the oscillator frequency control circuits 96, 98, 100, and 102 may be implemented in software running on the DSP 86, or may be implemented outside of the DSP 86 without departing from the scope of the present invention.

In a specific embodiment, the system 80 is implemented in an IS-136 mobile telephone. The telephone includes a chipset that implements the short-term frequency drift detector 96. The short-term frequency drift detector 96 can compensate for short-term drift of the reference frequency within a capture range of +/−2 parts per million and set the reference frequency to within +/−0.1 parts per million of the desired reference frequency. However, over time, the reference signal 90 can vary by an additional +/−3 parts per million due to aging of the master reference frequency source 54. When a transmitted control channel cannot be properly received, the master reference frequency source 54 is tuned by the reference frequency stepper 100 to the low side by 4 parts per million, which is twice the short-term capture range. If the control channel is still not properly received, the master reference frequency source 54 is tuned to the high side by four parts per million. Once the control channel is received, the compensation data is stored in the memory 102 for use by the DSP 86 until long-term frequency source drift causes another frequency stepping operation.

With only two frequency steps performed by the reference frequency stepper 100, a total range of 12 parts per million can be checked (+/−6 parts per million) allowing the master reference frequency source 54 to have a long-term drift of 4 parts per million. Analysis shows that in the IS-136 telephone, a maximum of two changes to the periodic reference signal 90 is required to account for typical aging of the master reference frequency source 54 and allow the short-term frequency drift detector 96 to zero-in the reference signal 90 to the desired reference frequency.

By implementing the system 80, frequency source specifications may be reduced without the addition of hardware, as the system 80 may be implemented in software or programmable hardware in the DSP 86. In addition, large firmware tables to store long-term frequency drift characterization data are not required. Furthermore, unlike prior art systems, the system 80 is a closed-loop system that ensures communication has been established subsequent to corrections applied to the master reference frequency source 54 by the system 80.

Figure 3:
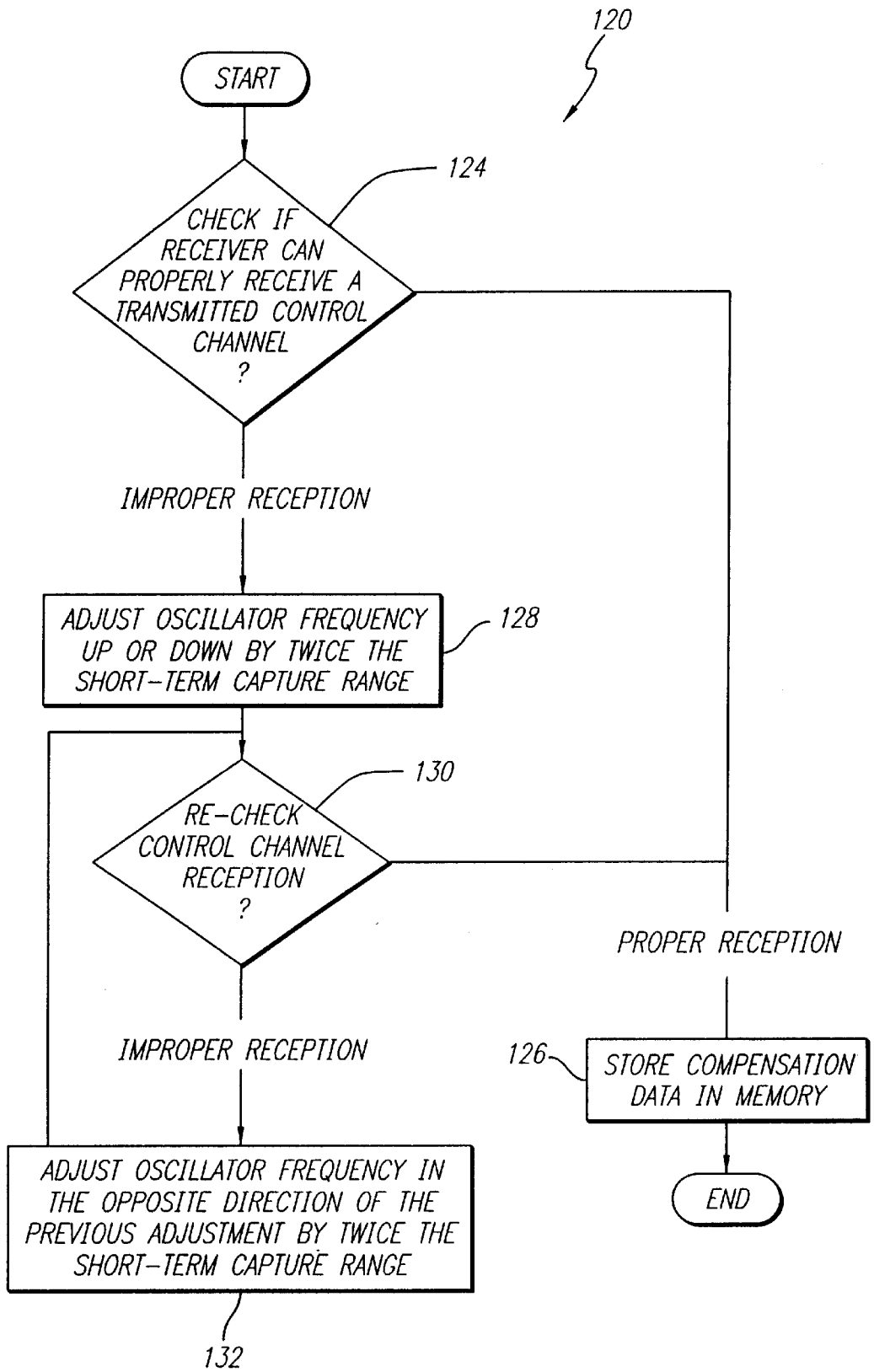
FIG. 3 is a flow diagram of the method implemented by the system of FIG. 1.

FIG. 3 is a flow diagram of an inventive method 120 implemented by the system of FIG. 1. Initially, a receiver is monitored for the reception of a transmitted control channel in a first monitoring step 124. If the control channel is not received or is not properly received as indicated by a failure of the received signal to meet certain communications system dependent test criterion, control is passed to a first frequency adjusting step 128. In the first frequency-adjusting step 128, an oscillator that provides a reference frequency to the receiver is adjusted so that the frequency of the reference signal output from the oscillator is increased either up or down by twice the short-term capture range of the receiver. Information corresponding to the adjustment is stored in a memory in the receiver's digital signal processor. If the control channel can be properly received, any necessary compensation data is stored in memory in a data-storing step 126, and the method is complete.

The short-term capture range of the receiver refers to the frequency range in which pre-existing electronics in the receiver can successfully detect frequency error and perform the necessary adjustments to achieve adequate control channel reception.

Subsequently, the receiver is monitored again in a second monitoring step 130 to determine if the control channel is receivable or has been properly received. If the control channel still has not been properly received, control is passed to a second frequency-adjusting step 132. In the second frequency-adjusting step 132, the reference frequency is adjusted by twice the short-term capture range in the opposite direction of the previous adjustment, and starting from the frequency before the previous adjustment performed in the first frequency-adjusting step 128. Control is then passed back to the second monitoring step 130. The second monitoring step 130 and the second frequency-adjusting step 132 form a loop that is exited when the receiver properly receives the control channel. Once the receiver successfully receives the control channel, data corresponding to the frequency adjustments performed in the first 128 and second 132 frequency-adjusting steps is stored in memory in the data-storing step 126, and the method is complete.

In most telecommunications systems, the loop formed by the second monitoring step 130 and the second frequency-adjusting step 132 must be performed at most once in response to age related oscillator frequency drift. Hence, method 120 typically results in minimal delay, allowing successful communications to be readily and quickly established after a communications error caused by reference frequency drift. Furthermore, the method 120 typically does not need to be performed on a frequent basis, so any delay resulting from the stepping operations 128, 132 is of minimal inconvenience. In addition, the method 120 is easily implement in software running on a receiver's digital signal processor. Hence, the present invention represents an accurate, hardware-efficient system and method capable of detecting and compensating for age related reference frequency drift.

Thus, the present invention has been described herein with reference to a particular embodiment for a particular application. Those having ordinary skill in the art and access to the present teachings will recognize additional modifications, applications and embodiments within the scope thereof It is therefore intended by the appended claims to cover any and all such applications, modifications and embodiments within the scope of the present invention.

Accordingly,

What is claimed is:

1. A system for compensating for reference frequency drift in a communications system comprising:

a frequency source for providing a reference frequency, said frequency source including a voltage-controlled temperature-compensated crystal oscillator;

error determination means for determining if said reference frequency is within a predetermined range of a desired reference frequency and providing an error signal in response thereto; and frequency correction means for stepping said reference frequency up and/or down by a predetermined amount in response to said error signal until said reference frequency is within said predetermined range of said desired reference frequency, said predetermined amount being an integer multiple of a short-term capture range of said reference frequency.

2. The invention of claim 1 wherein said error determination means includes a processor connected to a receiver and said frequency source in said communications system.

3. The invention of claim 2 wherein said processor includes a short-term frequency drift detector/compensator that generates a first control voltage input to said frequency source for correcting said reference frequency in response to said error signal.

4. The invention of claim 3 wherein said processor includes a digital signal processing circuit for processing signals received from said receiver and determining said error signal in response thereto.

5. The invention of claim 3 wherein said frequency correction means includes a long-term frequency drift detector/compensator that generates a second control voltage input to said frequency source for correcting said reference frequency in response to said error signal.

6. The invention of claim 5 wherein said long-term frequency drift detector has a correction input received from said short-term frequency drift detector indicating if said short-term frequency drift detector was successful in adjusting said reference frequency to said desired reference frequency.

7. The invention of claim 6 wherein said long-term frequency drift detector/compensator includes instructions to step said frequency up by approximately 4 parts per million and down by approximately 4 parts per million until said reference frequency is within said predetermined range.

8. The invention of claim 1 further including a receiver, said receiver having receive signal frequency conversion stages utilizing said reference frequency.

9. The invention of claim 8 wherein said predetermined range is dependant upon the reference frequency band in which said receiver can successfully receive and decode said receive signal.

10. The invention of claim 1 wherein said predetermined amount is twice the short-term capture range of said reference frequency.

11. The invention of claim 10 wherein said predetermined amount is approximately four parts per million.

12. The invention of claim 1 wherein said predetermined range is approximately the short-term capture range of said reference frequency.

13. The invention of claim 12 wherein said predetermined range is 0.1 parts per million.

14. The invention of claim 12 wherein said predetermined range is approximately six parts per million.

15. The invention of claim 12 wherein said predetermined range is determined by communications system specifications.

* * * * *